United States Patent [19]

Paredes

[11] 4,020,414
[45] Apr. 26, 1977

[54] PLURAL COMPARATOR INDICATOR OF BATTERY VOLTAGE

[75] Inventor: Alfredo E. Paredes, Miami, Fla.

[73] Assignee: Konar Corporation, Miami, Fla.

[22] Filed: Jan. 31, 1975

[21] Appl. No.: 546,099

[52] U.S. Cl. .............................. 324/29.5; 324/133; 340/249; 320/48
[51] Int. Cl.² ........................................ G01N 27/42
[58] Field of Search ................ 324/21, 29.5, 72.5, 324/123 R, 133; 340/248 B, 249; 320/48

[56] References Cited

UNITED STATES PATENTS

| 2,745,090 | 5/1956 | Grillo | 340/249 |
| 2,991,413 | 7/1961 | Taylor | 324/29.5 |
| 3,796,951 | 3/1974 | Joseph | 324/133 |

OTHER PUBLICATIONS

R. S. Fritz, "Indicating Lamp System for Diagnostic Measurement", IBM, Tech. Bul., vol. 16, No. 9, Feb. 1974, pp. 2841, 2842.

Primary Examiner—Rudolph V. Rolinec
Assistant Examiner—Michael J. Tokar
Attorney, Agent, or Firm—Malin & Haley

[57] ABSTRACT

A battery status indicator for use with a DC battery to provide an indication of the battery's ability to provide a necessary amount of charge and is especially useful in a vehicular electrical system using a DC battery. The system is characterized by using miniaturized integrated circuitry for reduced size and increased reliability of operation and includes a single package quad comparator in conjunction with a scaling network of resistors to show very small voltage changes to a network of indicators such as a lightbulb and alarm system. The system is capable of showing in a step-by-step sequence the progressional deterioration in the voltage level of the battery such that it allows one to continuously monitor the status of the battery prior to its becoming inoperable.

1 Claim, 2 Drawing Figures

PLURAL COMPARATOR INDICATOR OF BATTERY VOLTAGE

BACKGROUND OF THE INVENTION

This invention relates generally to a device for showing the charge level of a DC battery and more particularly to a device that will provide an indication of the ability of the battery to provide a charge over a given reference voltage scale. As is known, the use of DC voltage batteries, especially with and in conjunction with the electrical system in an automobile or boat is well known. It is not uncommon due to the high voltage demand necessary in starting an internal combustion engine that the battery will fail without giving any prior warning or notice, which could be very hazardous especially in the operation of a boat. The instant invention overcomes battery failure problems by providing an indication prior to the failure of the battery which would give adequate warning for a user to take steps to either have the battery recharged prior to its failure or to have it replaced. By providing a sequenced plurality of indicators the instant invention shows changes in the voltage of the battery, which are indicative of the charge capacity of the battery. The prior art shows a plurality of devices which are complicated and unreliable to provide an indication of battery voltage status. The instant invention is an improvement over the devices shown in the prior art in that it is miniaturized, uses extremely reliable circuit elements and provides extremely accurate settings and may be utilized in a variety of different voltage ranges which allows it to be used in many different voltage environments without having to alter radically any of the elements in the device. The device includes the use of a scaling voltage network which provides accuracy in the ± 5 millivolt range. The device also includes a plurality of switch positions which allows the indicators and alarm to be tested, if necessary.

BRIEF DESCRIPTION OF THE INVENTION

A device for providing the status of a DC voltage battery, the status being related to the charge capability of the battery comprising a DC voltage scaling network, said network including a plurality of voltage potentionmeters, a plurality of voltage comparators, each connected to one individual element of said voltage scaling network, a means for providing a reference voltage to said voltage comparators and an indicating means connected to the comparators, thus when each comparator is actuated an indication such as a lightbulb or alarm will be actuated, each of the voltage comparators being scaled or set at different levels relative to the reference voltage level. The device includes a test circuit which shorts out the scaling network to ground thus providing an indication to the comparators that the entire system is below reference voltage. The system may include an alarm when the battery condition is below an acceptable minimum standard which is necessary in the activation of a vehicle or the like. The device includes an element such as diode for protecting the polarity of the system. The system may use a particular or predetermined plurality or number of discreet voltage comparators in conjunction with particular branches of the voltage scale network to provide complete range and indication of any changes in the voltage of the battery and is especially adapted for use with a plurality of indicators. The device is adjustable to any range of DC battery discharge characteristics through the use of potentiometers and a Zener diode for providing the reference voltage and is accurate to settings of ± 5 millivolts. The scale network consists of a plurality of branches or resistors, each one having a variable resistance such as a potentiometer and connected to one side of the voltage comparator, the system utilizing a plurality of voltage comparators. The other side of voltage comparator is connected to a reference voltage provided by a Zener diode which, for conventional 12-volt batteries, may provide a reference voltage such as 9.1 volts DC. The scaling network provides a different resistive value in each branch of the network which is selected in magnitude such that if the scaled voltage in that particular branch drops below the 9.1 voltage reference, the voltage comparator is actuated. The voltage comparator will actuate and bias a transistor which is connected in-line to an indicator such as a lightbulb. Thus by providing a plurality of different scaling values, a complete spectrum of the voltage existing in the battery may be presented to the plurality of indicators in a step-by-step fashion.

As a typical value for a 12-volt system, a reference range is selected with the value of the maximum or 100% charge of the battery representing approximately 12.6 volts. At 75% of the charge the battery voltage may be 12.35 volts; while at 50%, 12.18; 25%, 11.88 volts; with a rapid drop-off from that point in percentage of charge. Each of the resistive values is then selected in the scaling network such that each branch of the network would represent a 75%, a 50% or the 25% voltage level. Thus the potentiometers in the scaling network will be adjusted to achieve these individual values, each network being connected to a different voltage comparator. The voltage comparators are comprised of an integrated circuit, such as a voltage quad comparator, with each branch or individual comparator connected to the separate branch of the scaling network. The system includes a diode connected upstream of the scaling network which insures the polarity protection of the network. Thus, the entire package or device may be packaged to provide a completely integrated device including transistors which are biased on to activate the indicators such as lightbulbs and an alarm.

It is an object of this invention to provide a DC battery status indicator having a plurality of indicating means to show a step-by-step sequence of different levels of voltage or charge capacity of the battery.

It is another object of this invention to provide a battery status indicator which utilizes integrated circuitry to provide miniaturization for a more compact unit.

And yet still another object of this invention is to provide a battery status indicator that is adaptable to any range of DC battery discharge and may be accurate to provide settings of ± 5 millivolts.

But still yet another object of this invention is to provide a battery voltage indicator which can be expanded to provide a plurality of indicators over a vast range or a small voltage change for increased accuracy of the system.

And yet still another object of this invention is to provide a voltage charge indicator for a DC battery for use in vehicles such as automobiles or boats which can provide a preliminary indication of the charged capacity of the battery to forewarn the user of the vehicle of impending failure of the battery.

In accordance with these and other objects which will be apparent hereinafter, the instant invention will now be described with particular reference to the accompanying drawings.

PREFERRED EMBODIMENT OF THE INVENTION

Figure 1:
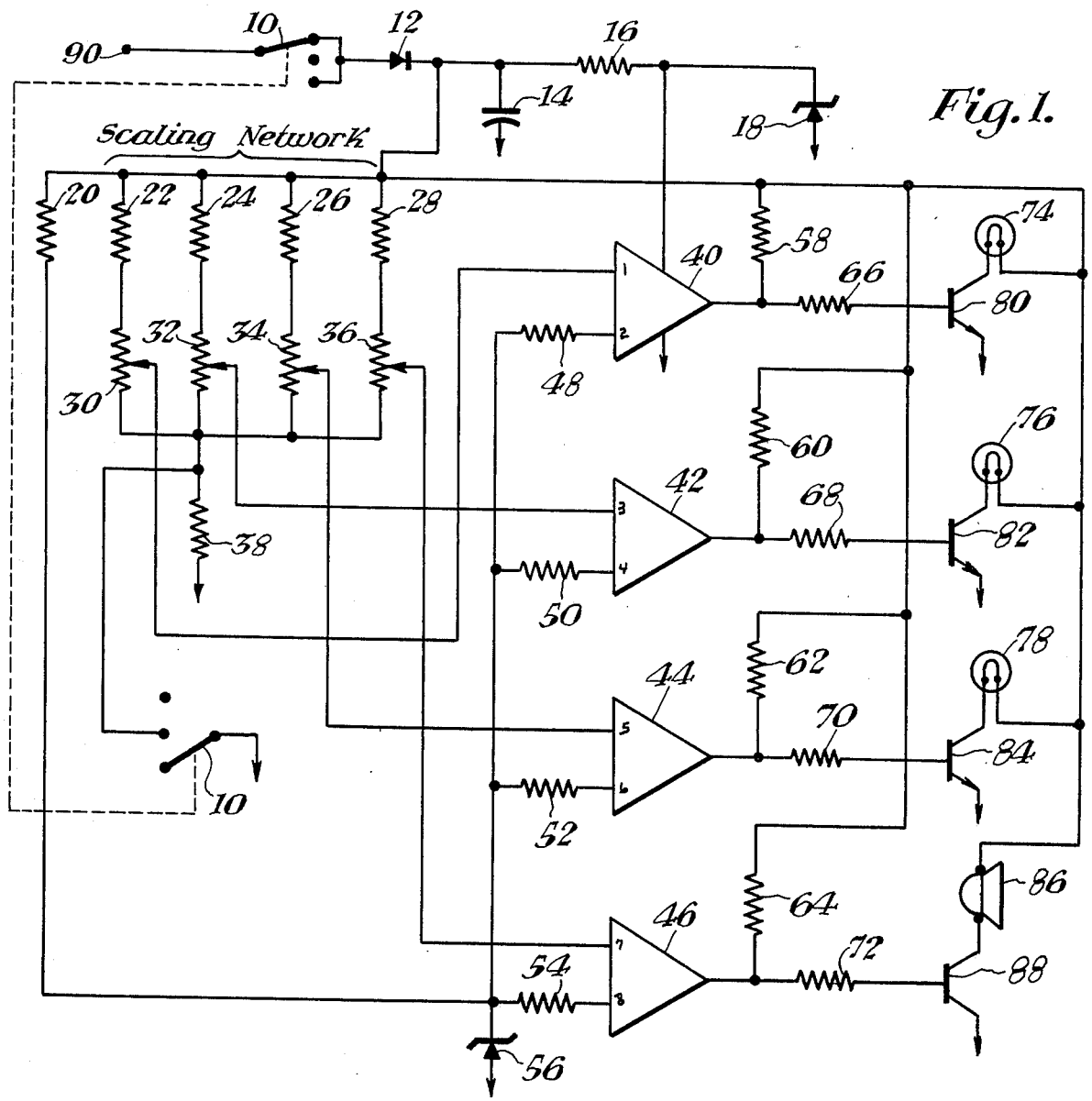
FIG. 1 shows a schematic circuit diagram of the instant invention.
Figure 2:
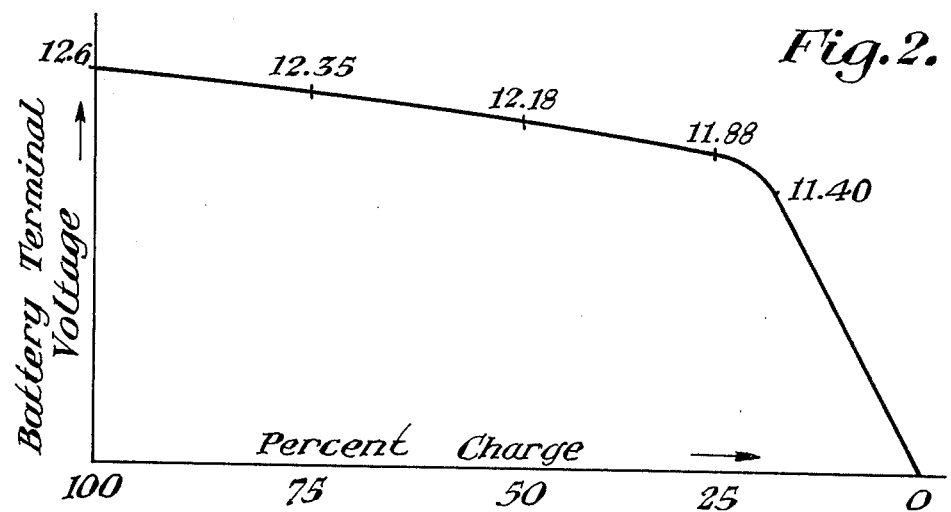
FIG. 2 shows a graph showing battery terminal voltage versus percentage of charge with particular points selected which are related to the operation of the preferred embodiment.

Referring now to the drawings and especially FIG. 1, Applicant's invention is shown as a representative embodiment having three distinct indicators 74, 76 and 78 which are light-bulbs and an alarm 86 which are individually actuated whenever the battery charge reaches predetermined voltage levels. FIG. 2 shows a graph of exemplary representative values which are related to values of the preferred embodiment shown. It should be understood that the device may include additional or less indicators actuated by different valves of battery voltage. The device is connected to a positive battery terminal 90 through a three position switch 10 which allows for an "off", an "on" and a test position, the switch being connected through diode 12 the diode acting as a protecting device to prevent reverse polarity in the circuit. The battery terminal 90 through the switch 10 and diode 12 is coupled to a scaling network which is comprised of a plurality of fixed resistors 20, 22, 24, 26 and 28 and variable resistors 30, 32, 34 and 36 with the resistors divided into individual branches of different values to provide various voltages to the input lead to a plurality of voltage comparators 40, 42, 44 and 46. Resistors 22 and variable resistor 30 are connected to the input lead (terminal 1) of voltage comparator 40. Resistor 24 and variable resistor 32 is connected to the input lead to terminal 3 of voltage comparator 42. Resistor 26 and variable resistor 34 are coupled to the input lead to terminal 5 of voltage comparator 44. Resistor 28 and variable resistor 36 is connected to input terminal 7 of voltage comparator 46. A capacitor 14 is coupled to the battery terminal input line to act as a filter for outside noise. A Zener diode 18 is utilized and connected to the input line which stabilizes the reference voltage of 9.1 volts (for 12 volt system). The values of the resistors 22, 24, 26 and 28 are selected to provide relative voltage values which will be utilized at the input terminal of the voltage comparator as particular points relative to the battery conditions, each of which activates the particular voltage comparator. A Zener diode 56 is connected to the second input terminal to voltage comparators 40, 42, 44 and 46 to maintain a 9.1 reference voltage into each of these terminals. The output of the voltage comparators 40, 42, 44 and 46 are connected respectively to the base of transistors 80, 82, 84 and 88. An output signal from each of these voltage comparators will act to bias transistors 80, 82, 84 and 88 to conduct in an on mode, thus completing the circuit with the lightbulb indicators 74, 76, 78 and the alarm 86 respectively relative to each individual voltage comparator. Thus each voltage comparator will be responsible for a particular indicator or alarm actuation and acts in conjunction therewith independently of the remaining indicators and is only dependent upon particular voltage values of the battery and its condition for activation. The potentiometers 30, 32, 34 and 36 may be adjusted to provide for particular battery voltage values, each value actuating a particular indicator. Resistors 48, 50, 52 and 54 act as current limiters for the input pins into the voltage comparators.

In operation since the charge level and the measurable voltage of a conventional lead acid chemical DC battery are precisely related, as shown in the preferred embodiment, four different voltage levels are scaled and connected to the sense input of comparators 40, 42, 44 and 46 at input terminals 1, 3, 5 and 7 respectively. Typical values, when utilizing a 12 volt battery, would be shown in FIG. 2 which represents selecting pre-scaled voltage values of the battery relating it to a percent of charge which may be indicated on the device by the illumination of a particular lightbulb. For the sake of an example, the voltage comparator 40 will be actuated if the actual battery voltage reaches 12.35 volts, while comparator 42 will be actuated if the actual battery value is 12.18, voltage comparator 44 being actuated at 11.88 battery voltage and voltage comparator 46 being actuated at 11.4 volts of actual battery voltage. These values could be utilized to respectively show that the percent of charge would be 75%, 50%, 25% and 15% respectively. As the battery voltage discharges to the 12.35 voltage (75% charge) the scaling network of scale reduces the voltage to a voltage less than the reference network; the scaling network in this branch having resistor 22 and potentiameter 30. Thus when the voltage on pin 1 of voltage comparator 40 drops below the reference voltage, i.e. 9.1 volts, through the scaling branch of resistors (which means the actual battery voltage is 12.35 volts), the comparator will be actuated biasing transistor 80 to a conducting position illuminating lightbulb 74.

The scaling network which is a resistor divider network using potentiometers is pre-settable from plus or minus 5 millivolts. The network also has a fixed resistor of a particular value in the particular network branch which is utilize with an individual voltage comparator and potentiometer or variable resistor which provides for the pre-setting voltage value.

Switch 10 is a three-position switch which provides power on, power off and test functions, the test function being utilized to illuminate and insure that the indicators, lightbulbs and alarm are functioning properly. In the test position, the resistive scaling network is biased by shorting resistor 38 to ground, thus presenting all the voltage comparators with a simulated discharge battery condition. Thus with all voltage comparators activated simultaneously, the indicators and alarm should be activated. The Zener diode 18 is utilized to regulate the voltage comparator supply voltages.

The circuit is designed to have a very low current draw when on with no indicators actuated. The current draw in the indicator mode when one or more comparators are activated will of course be determined by the current draw of the lamps employed and the alarm employed. Very low current draw in the indicator mode could be achieved using LED's or very low current drawing bulbs.

As shown in the preferred embodiment, the four voltage comparators may be comprised of an integrated circuit using a quad voltage comparator as the sensing element, thus allowing the utilization of completely integrated circuits throughout the system. With the use of the potentiometers in the scaling network, the system is adjustable to any range DC battery discharge and is accurate to settings of ± 5 millivolts. Likewise the system is capable of giving visual or audio indications or could be employed or trigger other devices to provide additional warning or indications of the battery conditions. Although in the preferred embodiment three indicator lamps and one alarm is shown, the circuit is adaptable to have more or less indicating units dependent upon the particular environment, use and accuracy desired.

The instant invention has been shown and described herein in what is considered to be the most practical and preferred embodiment. It is recognized, however, that departures may be made therefrom within the scope of the invention and that obvious modifications will occur to a person skilled in the art.

What I claim is:

1. A battery charge capacity indicator for providing an indication of charge capacity of said battery comprising:

a pair of battery connecting terminals;

voltage divider network means connected to said battery connecting terminal;

a plurality of voltage comparators, each comparator having a first input individually connected to one of said branches of said voltage divider network means;

means connected to said battery connecting terminals for providing a reference voltage, said reference voltage means connected as a second input to each of said volatage comparators;

a plurality of biased switching means, each switching means connected to a different output of each of said voltage comparators which provides an input signal to bias individual switching means;

a plurality of indicating means, each individual indicator means connected to a different biased switching means, circuit switching means connected to said battery connecting terminals having a first, second and third position providing a on-off test position of said circuit.

* * * * *